United States Patent
Huang et al.

[11] Patent Number: 6,080,637
[45] Date of Patent: Jun. 27, 2000

[54] SHALLOW TRENCH ISOLATION TECHNOLOGY TO ELIMINATE A KINK EFFECT

[75] Inventors: Kuo Ching Huang, Kaohsiung; Tse-Liang Ying, Hsin-Chu; Wen-Chuan Chiang, Hsin-Chu; Cheng-Yeh Shih, Hsin-Chu, all of Taiwan

[73] Assignee: Taiwan Semiconductor Manufacturing Company, Hsin-Chu, Taiwan

[21] Appl. No.: 09/206,736

[22] Filed: Dec. 7, 1998

[51] Int. Cl.$^7$ .................................................. H01L 21/76
[52] U.S. Cl. ........................ 438/424; 438/296; 438/425; 438/426; 148/DIG. 50
[58] Field of Search ...................... 438/424, 296, 438/425, 426, 421; 148/DIG. 50

[56] References Cited

U.S. PATENT DOCUMENTS

| | | | |
|---|---|---|---|
| 5,132,241 | 7/1992 | Su | 437/70 |
| 5,258,332 | 11/1993 | Horioka et al. | 438/424 |
| 5,447,884 | 9/1995 | Fahey et al. | 437/67 |
| 5,521,422 | 5/1996 | Mandelman et al. | 257/510 |
| 5,578,518 | 11/1996 | Koike et al. | 438/424 |
| 5,633,191 | 5/1997 | Chao | 438/448 |
| 5,712,185 | 1/1998 | Tsai et al. | 438/424 |
| 5,721,174 | 2/1998 | Peidous | 438/445 |
| 5,728,622 | 3/1998 | Yu | 438/443 |
| 5,731,241 | 3/1998 | Jang et al. | 438/424 |
| 5,780,346 | 7/1998 | Arghavani et al. | 438/296 |
| 5,837,612 | 11/1998 | Ajuria et al. | 438/697 |
| 5,880,004 | 3/1999 | Ho | 438/421 |

*Primary Examiner*—Charles Bowers
*Assistant Examiner*—David S Blum
*Attorney, Agent, or Firm*—George O. Saile; Stephen B. Ackerman

[57] ABSTRACT

A process for creating an insulator filled, shallow trench, in a semiconductor substrate, in which the insulator layer in the shallow trench, is not exposed to procedures used to remove defining composite insulator layers, has been developed. The process features creating a lateral recess, in a thick silicon nitride layer, used as a component of a composite insulator layer, where the composite insulator layer is used for subsequent definition of the shallow trench, in the semiconductor substrate. An insulator deposition, filling openings, and recesses, in the composite insulator layer, and filling the shallow trench, followed by removal of excess insulator fill, on the top surface of the composite insulator layer, results in the formation of a "T" shape insulator, comprised of an insulator shape, in the shallow trench, and comprised of a wider insulator shape, located in the composite insulator shape, with the lateral recess in the thick silicon nitride layer, and with the wider insulator shape, overlying the narrow, insulator shape, in the shallow trench. The insulator, in the shallow trench, is protected from the procedure used to remove components of the composite insulator layer, by the wider insulator shape.

25 Claims, 4 Drawing Sheets

6,080,637

SHALLOW TRENCH ISOLATION TECHNOLOGY TO ELIMINATE A KINK EFFECT

BACKGROUND OF THE INVENTION (1) Field of the Invention

The present invention relates to a method used to fabricate an insulator filled, shallow trench, isolation region for a semiconductor device.

(2) Description of Prior Art

Micro-miniaturization, or the use of sub-micron features, have allowed the semiconductor industry to increase the performance of semiconductor chips, while still reducing the processing cost of these same semiconductor chips. Micro-miniaturization has mainly been realized as a result of advances in semiconductor fabrication disciplines such as photolithography and dry etching. The use of more advanced exposure cameras, as well as the development of more sensitive photoresist materials, have allowed sub-micron features to be routinely achieved in photoresist layers, while advances in dry etching tools and processes, have allowed the sub-micron features in overlying photoresist layers to be easily transferred to the underlying materials used for semiconductor chip fabrication. Semiconductor chips, with sub-micron features, result in reductions in performance degrading capacitances and resistances, thus improving device performance. In addition the use of sub-micron features allow smaller semiconductor chips to be created, however still exhibiting the same device densities achieved with larger chips, however reducing processing costs as a result of attaining more chips for a specific size substrate.

In addition to performance and cost objectives being realized via the use of sub-micron features, specific elements of semiconductor devices, have been modified to achieve additional performance and cost benefits. For example isolation regions, formed in non-device regions of the semiconductor chip, via LOCal Oxidation of Silicon, (LOCOS), can consume valuable area, via an unwanted "birds beak" phenomena. "Birds beak", or an encroachment of the isolation oxide region, under an insulator mask used to protect active device regions from the LOCOS process, results in unwanted consumption of a silicon region, that had allotted for the active device region. Therefore active device regions have to designed with larger areas, to accommodate for the encroachment effect, therefore resulting in larger semiconductor chips. The use of shallow trench isolation, (STI), in which a shallow trench is etched in a semiconductor substrate, followed by the filling of the trench with an insulator layer, allows the designed dimension of the isolation region to be achieved, without the encroachment phenomena experienced via the LOCOS isolation technology.

The formation of STI regions can however present unwanted device phenomena, such as a "kink effect", resulting from a recessing of insulator fill layer, at the edge of the shallow trench, during removal of a pad oxide layer, where the pad oxide layer is used a component of a composite insulator mask, used for STI definition. The recessing of the insulator layer, in the shallow trench, is predominately at the edges of the shallow trench, resulting in a thinner gate insulator layer, grown at the edge of the shallow trench, thus allowing premature turn on thresholds to occur. The "kink effect" refers to a "kink", or a break, in the curve relating drain—source current, (Ids), as a function of gate voltage, (Vg). This invention will describe a process for eliminating the thinning of the insulator layer, at the edges of the shallow trench, thus avoiding the unwanted "kink effect". This is accomplished by initially creating a "T" shaped insulator, in a shallow trench opening, featuring a top portion of the insulator shape, overlying the insulator layer in shallow trench, with the top portion of the "T" shaped insulator, wider than the shallow trench, thus located overlying a portion of the pad oxide layer, thus protecting the insulator fill, at the edge of the shallow trench, during the pad oxide removal procedure. Prior art, such as Yu, in U.S. Pat. No. 5,728,622, describes a LOCOS isolation region, with a "T" shape. However that prior art does not describe the "T" shape, STI region, and the process used for the STI region, described in this present invention.

SUMMARY OF THE INVENTION

It is an object of this invention to create a shallow trench isolation, (STI), region, in a semiconductor substrate.

It is another object of this invention to initially form a "T" shaped insulator, with a narrow, bottom portion of the "T" shape insulator, located in a shallow trench, and with the wider, top portion of the. "T" shaped insulator, overlying the narrow, bottom portion of the "T" shaped insulator, in addition to overlying a region of a pad oxide layer, located adjacent to the edges of the shallow trench.

It is still another object of this invention to laterally etch back the thick silicon nitride component of the STI composite mask, to accommodate a chemically vapor deposited, insulator layer, forming the wider, top portion of the "T" shaped insulator.

It is still yet another object of this invention to remove the wider, top portion, of the "T" shaped insulator, and the underlying pad oxide layer, without exposure of the edges of the insulator filled, shallow trench.

In accordance with the present invention a method is described for creating an insulator shape, to be used for a STI region, in which an initial "T" shaped insulator, is formed in, and adjacent to, a shallow trench, and used to protect the insulator in the shallow trench, during the removal of the masking layers, used for shallow trench definition. An opening in a photoresist shape is first used as a mask to create an opening in a composite masking layer, comprised of a capping silicon oxide layer, a thick silicon nitride layer, and an underlying pad oxide layer, directly followed by the formation of the shallow trench, in the semiconductor substrate. Thermal oxidation procedures are then used to grow a silicon dioxide layer, on the exposed silicon surfaces, of the shallow trench, while a thinner silicon oxide layer forms on the surfaces of the silicon nitride layer, exposed in the opening in the composite masking layer. After a hydrofluoric acid procedure, used to remove the thin silicon oxide layer, from the sides of the silicon nitride layer, the silicon nitride layer is recessed back, under the capping silicon oxide layer, and exposing a portion of the underlying pad oxide layer, in a region adjacent to the edges of the shallow trench. A thick silicon oxide layer is next deposited, completely filling the shallow trench, and the opening in the composite insulator layer, including the recess in the silicon nitride. A chemical mechanical polishing, (CMP), procedure, is then employed to remove the thick silicon oxide, as well as the top silicon oxide layers, from the top surface of the silicon nitride layer, resulting in a "T" shaped insulator, comprised of a bottom insulator shape, in the shallow trench, and a wider, top insulator shape, located in the opening in the composite insulator layer, overlying the bottom insulator shape in the shallow trench. In addition a portion of, the wider, top insulator shape, overlays a portion of the pad oxide layer, located adjacent to the edges of the shallow trench. Selective removal of silicon nitride, followed by removal of the wider, top insulator shape, and of the pad oxide layer, results in a insulator filled, shallow trench, planar with the top surface of the semiconductor substrate, and with an absence insulator recessing, at the edges of the shallow trench.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
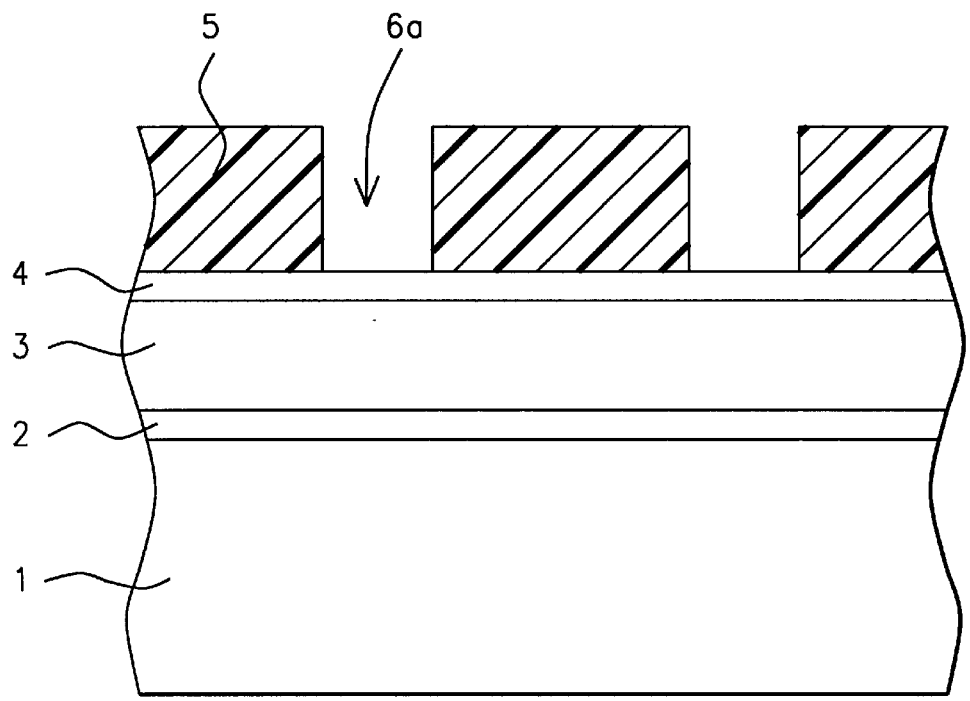
FIGS. 1–8, which schematically, in cross-sectional style, show the key stages of fabrication, used to create the insulator filled, shallow trench structure, formed from a "T" shaped insulator, and designed to avoid attack of insulator layer, at the edges of the shallow trench during the procedure used to remove a composite mask layer, used for shallow trench definition.

The method of creating an STI region, in a semiconductor substrate, featuring a "T" shape insulator, used to fill the shallow trench, and to protect the insulator in the shallow trench, during the procedure used to remove a composite mask layer, used for shallow trench definition, will now be described in detail. A P type, semiconductor substrate, 1, comprised of single crystalline silicon, with a <100> crystallographic orientation, is used and schematically shown in FIG. 1. A pad oxide layer 2, comprised of silicon dioxide, is thermally grown in an oxygen—steam ambient, to a thickness between about 70 to 300 Angstroms. Silicon nitride layer 3, is next deposited, via low pressure chemical vapor deposition, (LPCVD), or via plasma enhanced chemical vapor deposition, (PECVD), procedures, to a thickness between about 200 to 2000 Angstroms, followed by the deposition of a capping silicon oxide layer 4, via LPCVD or PECVD procedures, to a thickness between about 50 to 300 Angstroms. Photoresist shape 5, is then formed on capping silicon oxide layer 4, featuring opening 6a, at a width between about 0.10 to 10 um. Opening 6a, schematically shown in FIG. 1, exposes the top surface of capping silicon oxide layer 4.

Figure 2:
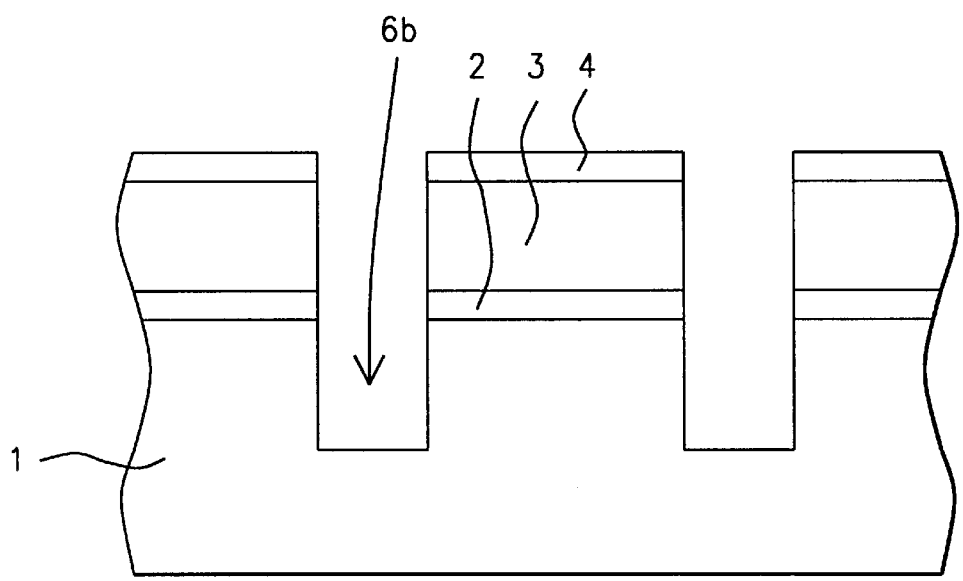

An anisotropic reactive ion etching, (RIE), procedure, is next performed, using photoresist shape 5, as a mask, transferring opening 6a, in photoresist shape 5, to the composite masking layers, comprised of capping silicon oxide layer 4, silicon nitride layer 3, and pad oxide layer 2, while creating shallow trench 6b, in semiconductor substrate 1. This is schematically shown in FIG. 2. The anisotropic RIE procedure is performed using $CHF_3$ as an etchant for silicon oxide layer 4, and for silicon nitride layer 3, and using a wet hydrofluoric acid dip, for pad oxide layer 2, creating the opening in the masking composite insulator layer, while either $SF_6$ or $Cl_2$, is used to define shallow trench 6b, in semiconductor substrate 1. Shallow trench 6b, is formed to a depth between about 500 to 3000 Angstroms, in semiconductor substrate 1, with the width of shallow trench 6b, being equal to the width of opening 6a, in photoresist shape 5, between about 0.10 to 10 um. Photoresist shape 5, is then removed using plasma oxygen ashing, and careful wet cleans.

Figure 3:
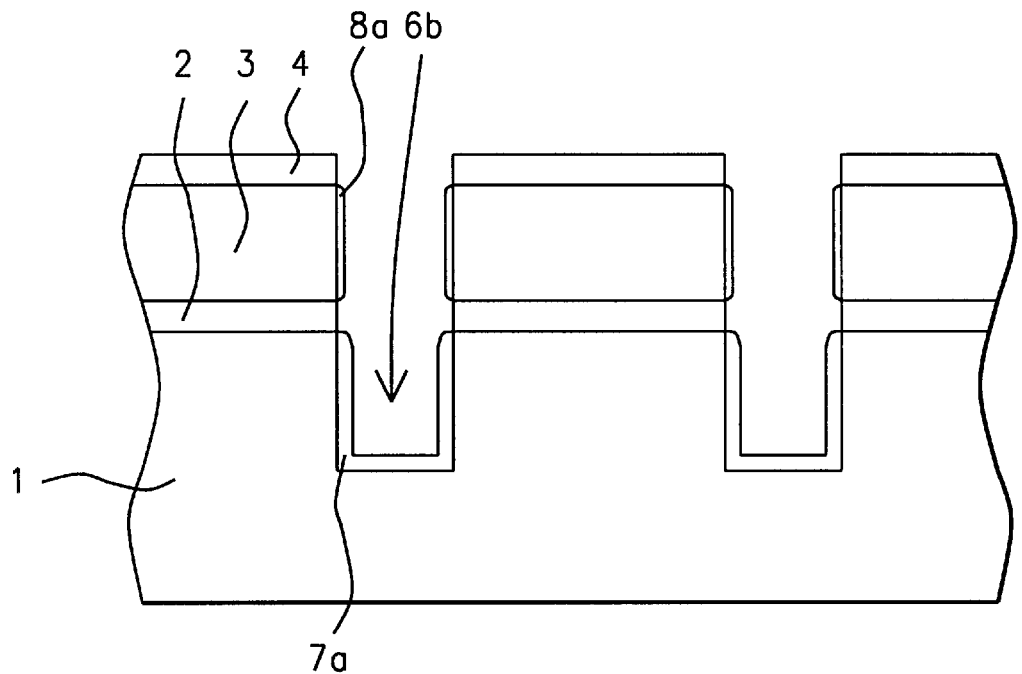

A critical step of this invention, the formation of a protective silicon oxide liner, is next addressed, and schematically shown in FIG. 3. A thermal oxidation procedure, performed at a temperature between about 800 to 1000° C., in dry oxygen, is next employed, resulting in silicon dioxide layer 7a, forming on the exposed surfaces of shallow trench 6b, at a thickness between about 300 to 400 Angstroms. The thermal oxidation procedure also results in the formation of silicon oxide layer 8a, on the exposed surface of silicon nitride layer 3, but only at a thickness between about 10 to 20 Angstroms. A dilute hydrofluoric, (DHF), or a buffered hydrofluoric, (BHF), exposure, between about 30 to 60 sec, is then used to remove thin, silicon oxide layer 8a, exposing the sides of silicon nitride layer 3, however silicon dioxide layer 7a, on the sides of shallow trench 6b, was only thinned, resulting in silicon oxide layer 7b, now between about 150 to 250 Angstroms, in thickness, still remaining on surfaces of shallow trench 6b.

Figure 4:
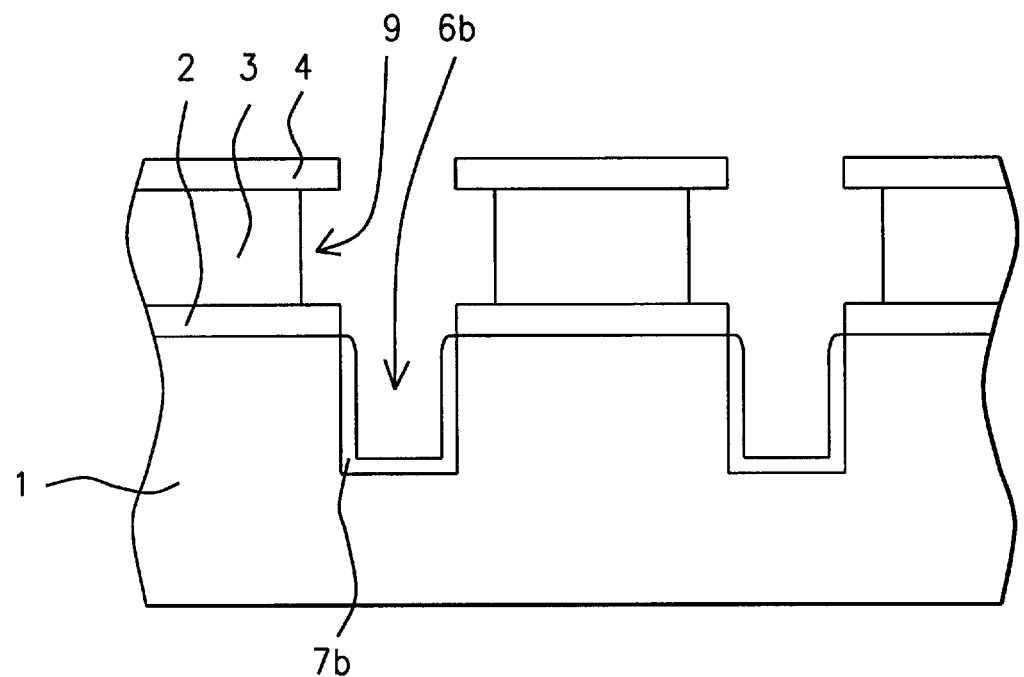
Figure 5:
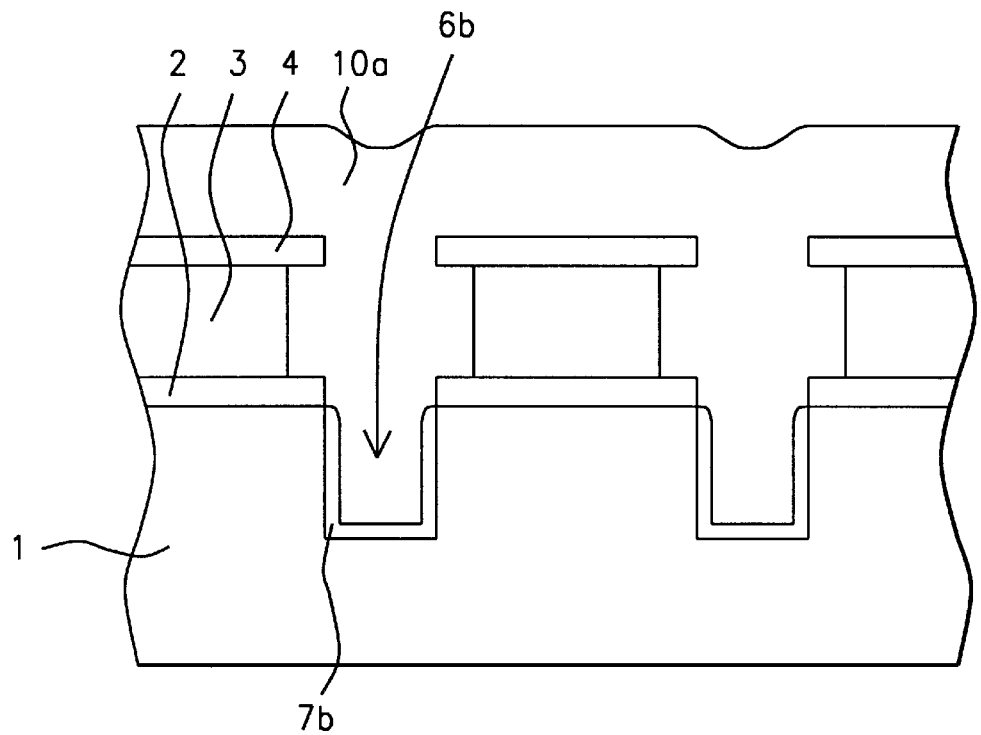

The exposed regions of silicon nitride layer 3, are next subjected to an isotropic wet etch procedure, using a hot phosphoric acid solution, resulting in the etch back of silicon nitride layer 3, creating recess 9, shown schematically in FIG. 4. Silicon regions, in shallow trench 6b, were protected from the hot phosphoric acid procedure, by silicon dioxide layer 7b. The amount of recess 9, resulting from the selective, isotropic, wet etch procedure, is between about 100 to 500 Angstroms, exposing a portion of pad oxide 2, adjacent to the edges of shallow trench 6b. A thick silicon oxide layer 10a, obtained using sub-atmospheric chemical vapor deposition, (SACVD), procedures, at a thickness between about 2000 to 10000 Angstroms, is used to: completely fill shallow trench 6b; completely fill recess 9; and to overlay the top surface of silicon oxide layer 4. This is schematically shown in FIG. 5.

Figure 6:
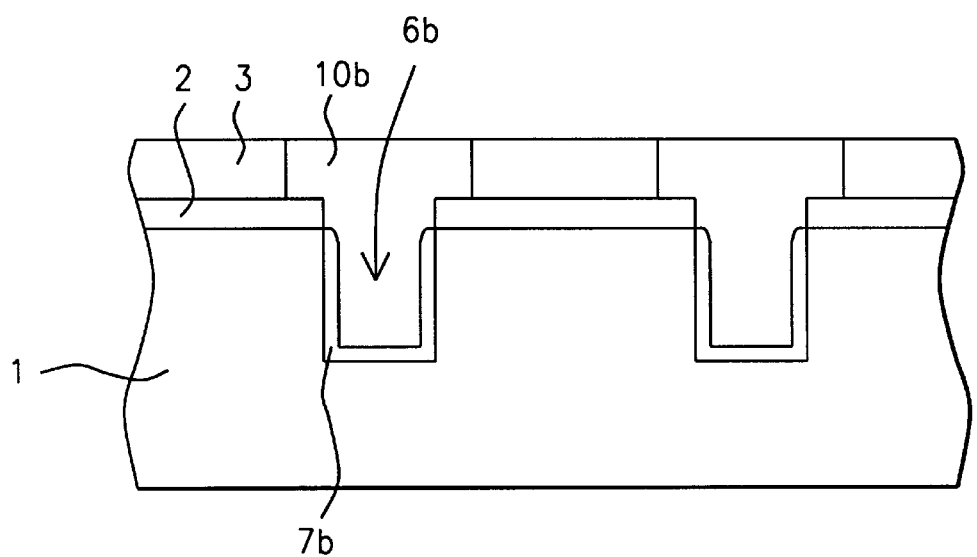
Figure 7:
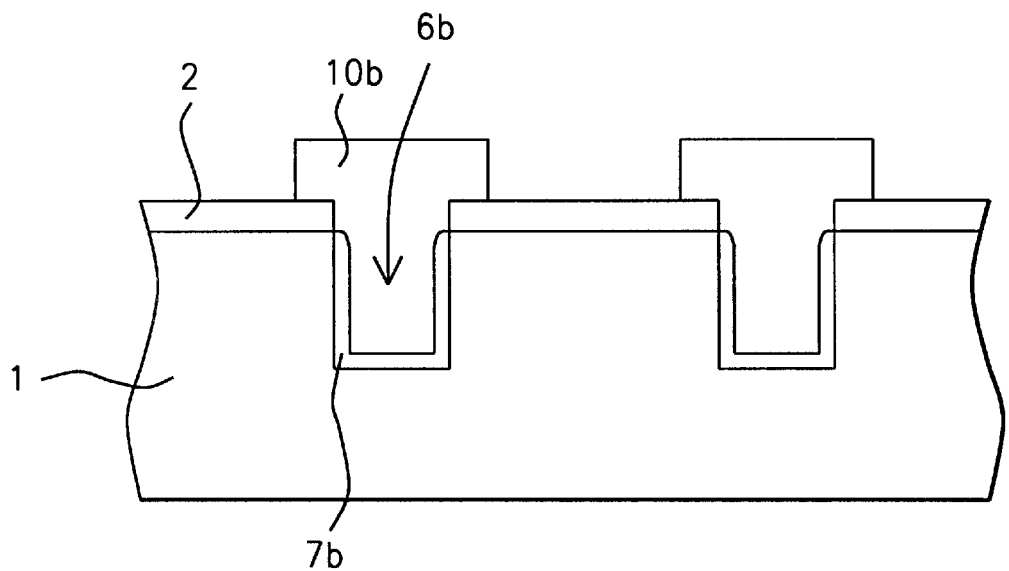
Figure 8:
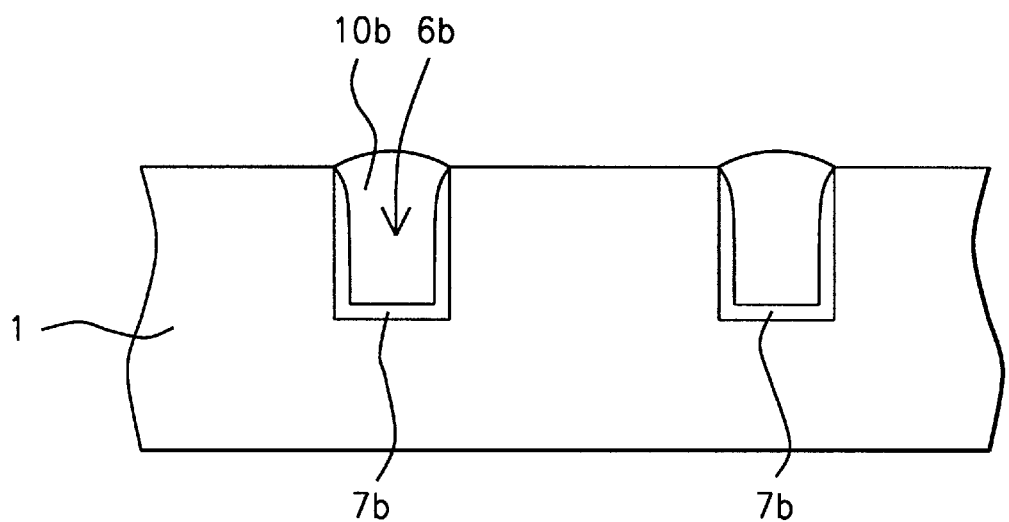

A chemical mechanical polishing, (CMP), procedure, is next used to remove portions of thick insulator layer 10a, and capping silicon oxide layer 4, stopping on the top surface of silicon nitride layer 3. The CMP procedure results in the formation of a "T" shaped insulator layer 10b, comprised of a wide top portion, at a width between about 0.11 to 10.1 um, overlying the narrower, insulator filled, shallow trench 6b. The top portion of the "T" shaped insulator layer 10b, schematically shown in FIG. 6, in addition to overlying the narrower, insulator filled, shallow trench 6b, also overlays a portion of pad oxide layer 2, in a region adjacent to the edges of insulator filled, shallow trench 6b. Silicon nitride layer 3, is next selectively removed using a hot phosphoric acid solution, resulting in the "T" shaped insulator layer 10b, shown schematically in FIG. 7, comprised of the insulator filled shallow trench 6b, and the overlying, top portion of "T" shaped insulator layer 10b, featuring a portion of this shape, overlying, and protecting a region of pad oxide layer 2. Removal of top portion of "T" shaped insulator layer 10b, and of pad oxide layer 2, are next addressed using either a wet BHF or DHF solution, or via use of a selective RIE procedure, using $CHF_3$. The edges the insulator filled, shallow trench 6b, were only exposed to the wet etch or to the RIE cycle, after complete removal of the top portion of "T" shaped insulator layer 10b, and of pad oxide layer 2, therefore not attacked by the etchant. This is schematically shown in FIG. 8. If top portion of "T" shaped insulator layer 10b, were not wider than the insulator filled, shallow trench 6b, the edges of insulator filled shallow trench would have been subjected to the entire removal procedure. Attack, or recessing of insulator layer 10a, near the edges of the shallow trench, can result in a thinner gate insulator layer, thermally grown at the edges of the STI region, thus allowing lower than desired, turn on voltages to occur at these regions. Growth of a sacrificial oxide layer, (not shown in the drawings), and removal of the sacrificial oxide layer, via a BHF or a DHF, prepares the active device region, the region, not occupied by insulator filled, shallow trench 6b, for subsequent metal oxide semiconductor field effect transistor, (MOSFET), processing.

While this invention has been particularly shown and described with reference to, the preferred embodiments thereof, it will be understood by those skilled in the art that various changes in form and details may be made without departing from the spirit or scope of this invention.

What is claimed is:

1. A method of forming an insulator filled, shallow trench, isolation region, in a semiconductor substrate, comprising the steps of:

forming a composite insulator on said semiconductor substrate comprised of an underlying pad oxide layer, a silicon nitride layer, and an overlying capping silicon oxide layer;

creating an opening in said composite insulator layer, using a photoresist shape as a mask, exposing top surface of semiconductor substrate;

creating a shallow trench, in said semiconductor substrate, using said photoresist shape as a mask;

performing a thermal oxidation procedure, to grow a sidewall silicon dioxide layer, on the exposed surfaces of said shallow trench, while forming a thin sidewall silicon oxide layer, on the sides of said silicon nitride layer, exposed in said opening, in said composite insulator layer;

performing a first wet etch procedure to remove said thin sidewall silicon oxide layer, from the sides of said silicon nitride layer;

performing a second wet etch procedure, to laterally recess silicon nitride layer, under said capping silicon oxide layer, and exposing a portion of said pad oxide layer, located adjacent to the edges of said shallow trench;

depositing a thick silicon oxide layer, completely filling said shallow trench, completely filling said opening in said composite insulator layer, including completely filling region of laterally recessed silicon nitride layer, and with said thick silicon oxide layer overlying the top surface of said capping silicon oxide layer;

removing a portion of said thick silicon oxide layer, and said capping silicon oxide layer, from the top surface of said silicon nitride layer, creating a "T" shaped insulator, comprised of a narrow, thick silicon oxide shape, located in said shallow trench, and a wide, thick silicon oxide shape, overlying said narrow, thick silicon oxide shape, and overlying said portion, of said pad oxide layer, located adjacent to the edges of said shallow trench;

removing said silicon nitride layer; and removing said wide, thick silicon oxide shape, and said pad oxide layer, to form said insulator filled, shallow trench.

2. The method of claim 1, wherein said pad oxide layer, of said composite insulator layer, is a silicon dioxide layer, thermally grown in an oxygen—steam ambient, to a thickness between about 70 to 300 Angstroms.

3. The method of claim 1, wherein said silicon nitride layer, of said composite insulator layer, is obtained via LPCVD or PECVD procedures, at a thickness between about 200 to 2000 Angstroms.

4. The method of claim 1, wherein said capping silicon oxide layer is obtained via LPCVD or PECVD procedures, at a thickness between about 50 to 300 Angstroms.

5. The method of claim 1, wherein said shallow trench is formed with a width between about 0.10 to 10 um, and at a depth, in said semiconductor substrate, between about 500 to 3000 Angstroms.

6. The method of claim 1, wherein said sidewall silicon dioxide layer, between about 300 to 400 Angstroms in thickness, located on the surfaces of said shallow trench, is obtained via said thermal oxidation procedure, performed in a dry oxygen ambient, at a temperature between about 800 to 1000° C.

7. The method of claim 1, wherein said thin sidewall silicon oxide layer, between about 10 to 20 Angstroms in thickness, located on the sides of said silicon nitride layer, is formed via said thermal oxidation procedure, at a temperature between about 800 to 1000° C., in a dry oxygen ambient.

8. The method of claim 1, wherein said first wet etch procedure, used to remove said thin sidewall silicon oxide layer, from the sides of said silicon nitride layer, is performed using a buffered hydrofluoric acid solution, or a dilute hydrofluoric acid solution, for a time between about 30 to 60 sec.

9. The method of claim 1, wherein said second wet etch procedure, used to laterally recess said silicon nitride layer, is performed using a hot phosphoric acid solution, resulting in a lateral recess of said silicon nitride layer, between about 100 to 500 Angstroms.

10. The method of claim 1, wherein said thick silicon oxide layer is obtained via SACVD procedures, to a thickness between about 2000 to 10000 Angstroms.

11. The method of claim 1, wherein the width of said wide, thick silicon oxide shape, of said "T" shaped insulator, is between about 0.11 to 10.1 um.

12. A method of creating an insulator filled, shallow trench, in a semiconductor substrate, in which a wide, thick silicon oxide shape, is used to protect the insulator layer in the shallow trench, during subsequent etching procedures, comprising the steps of:

growing a silicon dioxide, pad insulator layer, on said semiconductor substrate;

depositing a thick silicon nitride layer, on said silicon dioxide, pad oxide layer;

depositing a capping silicon oxide layer, on said thick silicon nitride layer;

forming a photoresist shape, on the top surface of a composite insulator layer, comprised of said capping silicon oxide layer, of said thick silicon nitride layer, and of underlying, said silicon oxide, pad insulator layer, with an opening in said photoresist shape, exposing a portion of the top surface of said capping silicon oxide layer;

performing a first anisotropic RIE procedure, to create an opening in said composite insulator layer, using said photoresist shape as a mask;

performing a second anisotropic RIE procedure, using said photoresist shape as a mask, to create a shallow trench in said semiconductor substrate;

performing a thermal oxidation procedure, in a dry oxygen ambient, to grow a sidewall silicon dioxide layer, on the exposed surfaces of said shallow trench, and to grow a thin sidewall silicon oxide layer, on the sides of said thick silicon nitride layer, exposed in said opening, in said composite insulator layer;

removing said thin sidewall silicon oxide layer, from the sides of said thick silicon nitride layer;

isotopically etching back, said thick silicon nitride layer, creating a lateral recess in said thick silicon nitride layer, located between overlying, said capping silicon oxide layer, and underlying silicon dioxide, pad insulator layer, and with said lateral recess, exposing a portion of said silicon dioxide, pad insulator layer, located adjacent to the edges of said shallow trench;

depositing a thick silicon oxide layer, completely filling said shallow trench, completely filling said recess in said thick silicon nitride layer, and overlying said composite insulator layer;

removing the portion of said thick oxide layer, located on the top surface of said capping silicon oxide layer, then removing said capping silicon oxide layer, from the top surface of said thick silicon nitride layer, creating a "T" shaped insulator, comprised of said wide, thick silicon oxide shape, located in opening in said recess in said thick silicon nitride layer, and creating a narrow, thick insulator shape, located in said shallow trench, underlying said wide, thick silicon oxide shape;

removing said thick silicon nitride layer; and removing said wide, thick silicon oxide shape, and said silicon dioxide, pad insulator layer-resulting in said insulator filled, shallow trench.

13. The method of claim 12, wherein said silicon dioxide, pad insulator layer, is obtained via thermal oxidation procedures, in an oxygen—steam ambient, to a thickness between about 70 to 300 Angstroms.

14. The method of claim 12, wherein said thick silicon nitride layer is obtained via LPCVD or PECVD procedures, at a thickness between about 200 to 2000 Angstroms.

15. The method of claim 12, wherein said capping silicon oxide layer is obtained via LPCVD or PECVD procedures, at a thickness between about 50 to 300 Angstroms.

16. The method of claim 12, wherein said first anisotropic RIE procedure, used to create said opening, in said composite insulator layer, is performed using $CHF_3$ as an etchant for said capping silicon oxide layer, and for said thick silicon nitride layer, while a wet hydrofluoric acid dip is used as an etchant for said silicon dioxide, pad insulator layer.

17. The method of claim 12, wherein said second anisotropic RIE procedure, used to create said shallow trench, with a width between about 0.10 to 10 um, and to a depth in said semiconductor substrate, between about 500 to 3000 Angstroms, is performed using $Cl_2$, or $SF_6$, as an etchant.

18. The method of claim 12, wherein said sidewall silicon dioxide layer, on the surfaces of said shallow trench, is formed via said thermal oxidation procedure, at a temperature between about 800 to 1000° C., in a dry oxygen ambient, to a thickness between about 300 to 400 Angstroms.

19. The method of claim 12, wherein said thin silicon oxide layer, on the sides of said thick silicon nitride layer, is obtained via said thermal oxidation procedure, performed at a temperature between about 800 to 1000° C., in a dry oxygen ambient, to a thickness between about 10 to 20 Angstroms.

20. The method of claim 12, wherein said thin silicon oxide layer is removed from the sides of said thick silicon nitride layer, using either a buffered hydrofluoric acid solution, or a dilute hydrofluoric acid solution, for a time between about 30 to 60 sec.

21. The method of claim 12, wherein said lateral recess, in said thick silicon nitride layer, is created via an isotropic wet etch procedure, using a hot phosphoric acid solution, with said lateral recess extending between about 100 to 500 Angstroms, under said capping silicon oxide layer.

22. The method of claim 12, wherein said thick silicon oxide layer, used to fill said shallow trench, and to fill said opening in said composite insulator layer, is obtained via a SACVD procedure, to a thickness between about 2000 to 10000 Angstroms.

23. The method of claim 12, wherein said wide, thick silicon oxide layer, of said "T" shaped insulator, is between about 0.11 to 10.1 um in width.

24. The method of claim 12, wherein said wide, thick silicon oxide shape, and said silicon dioxide, pad insulator layer, are removed using either an acid solution of BHF, or DHF.

25. The method of claim 12, wherein said wide, thick silicon oxide shape, and said silicon dioxide, pad insulator layer, are removed using a selective, RIE procedure, using $CHF_3$ as an etchant.

* * * * *